United States Patent [19]

Pickard et al.

[11] Patent Number: 4,503,480
[45] Date of Patent: Mar. 5, 1985

[54] VOLTAGE COMPENSATING DRIVER CIRCUIT

[75] Inventors: Ronald D. Pickard, Groton; John W. Reece; Joseph W. Racette, both of Ithaca, all of N.Y.

[73] Assignee: NCR Corporation, Dayton, Ohio

[21] Appl. No.: 467,526

[22] Filed: Feb. 17, 1983

[51] Int. Cl.³ .......................................... H01H 47/32
[52] U.S. Cl. ...................................... 361/152; 361/154
[58] Field of Search ............................. 361/152–154; 400/121, 124; 101/93.29, DIG. 15

[56] References Cited

U.S. PATENT DOCUMENTS

| | | | |
|---|---|---|---|
| 4,048,665 | 9/1977 | Lia et al. | 361/152 |
| 4,227,230 | 10/1980 | Bray | 361/152 |
| 4,238,813 | 12/1980 | Carp et al. | 361/154 |
| 4,326,234 | 4/1982 | Shuly | 361/154 |
| 4,381,532 | 4/1983 | Arnold | 361/154 |

FOREIGN PATENT DOCUMENTS

| | | | |
|---|---|---|---|
| 25627 | 2/1979 | Japan | 101/93.29 |
| 27603 | 2/1980 | Japan | 361/152 |
| 80710 | 5/1982 | Japan | 361/152 |
| 832617 | 5/1981 | U.S.S.R. | 361/154 |

OTHER PUBLICATIONS

IBM Technical Disclosure Bulletin, vol. 22, No. 8A, "Controller for Electromechanical Printhammer", 1/80.

Primary Examiner—Harry E. Moose, Jr.
Attorney, Agent, or Firm—Wilbert Hawk, Jr.; George J. Muckenthaler

[57] ABSTRACT

A voltage compensating driver circuit uses a resistor and a zener diode to remove the effect of potential difference between logic ground and power ground on the comparative function of the circuit and the supply voltage is applied as an input to the comparative function.

15 Claims, 4 Drawing Figures

VOLTAGE COMPENSATING DRIVER CIRCUIT

BACKGROUND OF THE INVENTION

In the field of supplying power for operating equipment, a voltage or potential source is generally provided that is sufficient to drive a given or known load or loads under variable conditions. In this respect, the actual load to be driven may vary due to operating characteristics or other parameters peculiar to the equipment and the results may be somewhat erratic or the operation may not be as smooth as desired.

In certain cases a variation in the supply voltage of as much as 15% above or below the nominal voltage may be realized and therefore the requirement for regulating or compensating for such variation is extremely important in providing for optimum operation. For example, in the specific case of driving print wires in printing operation, it is known that the effects of variations in the operating voltage on impact force and print quality range from illegible or skipped print dots under a low voltage condition to embossment or perforation of the record media under a high voltage condition.

One form of voltage compensation used in prior equipment has included means for detecting the voltage level and, depending upon a range within which the level occurs or falls, causing the proper associated pulse width to be selected from an available range to provide the proper operating voltage. While this form of compensation has been successful for accomplishing certain desired results, the enabling equipment has operated at reduced processing capacity and thus increased the costs of operation.

Representative documentation in the area of providing control of operating voltages includes U.S. Pat. No. 3,634,751, issued to S. A. Miller on Jan. 11, 1972, which discloses a voltage regulator having an operational amplifier and a plurality of constant and variable resistive means such as resistors and zener diodes, respectively. The output of the operational amplifier is coupled to both its positive and negative inputs such that the voltage across the terminal of one of the temperature compensated zener diodes is regulated and is stable with respect to time, temperature and load.

U.S. Pat. No. 3,760,192, issued to J. O. G. Darrow on Sept. 18, 1973, discloses a failsafe level detector including an amplifier and a zener diode in the circuit and wherein the zener diode is used as a signal path for an applied signal to the amplifier when the level is correct and is used to block the signal path when the applied signal level is incorrect.

U.S. Pat. No. 3,829,717, issued to C. E. Harrison on Aug. 13, 1974, discloses reference voltage compensation for a zener diode output voltage in a regulation circuit which uses a resistive voltage divider in parallel with and connecting the zener diode cathode to the negative voltage supply. The anode of the zener diode is connected with a compensating resistor to cause the voltage across the load to remain constant as a result of changing the positive voltage.

U.S. Pat. No. 3,946,302, issued to A. W. Kovalick et al. on Mar. 23, 1976, discloses a method and circuit for providing regulated power by controlling the duty cycle of a fixed frequency signal as a function of the amplitude of an applied voltage and utilizing a comparator along with resistors, capacitors and a zener diode in such circuit.

U.S. Pat. No. 4,237,405, issued to J. T. Kellis on Dec. 2, 1980, discloses a regulating circuit which includes a zener diode for maintaining a constant voltage at a common resistor junction of a fixed reference voltage source.

And, U.S. Pat. No. 4,290,005, issued to R. Arumugham on Sept. 15, 1981, discloses a compensated reference voltage source in a circuit that includes a first resistor, a zener diode and a second resistor connected in series between an operating voltage source and a point of fixed potential all in an arrangement for maintaining a stable voltage at the output terminal of the circuit which is equal to the voltage across the zener diode and remains constant despite variations in operating voltage.

SUMMARY OF THE INVENTION

The present invention relates generally to regulation or control of the utilization current in operating equipment where there may be variations in the supply voltage. More particularly, the present invention relates to circuitry that includes a compensated supply voltage arrangement for driving at least one reactive load such as a solenoid coil for actuating a print wire in a dot matrix printer.

Specifically, the circuitry includes a current limiting driver circuit to compensate for changes in the available supply voltage and for the number of inductive devices to be energized at any instant so that the output function (such as the impact force of a solenoid-actuated print wire) is maintained within a precise and limited range. The voltage compensation is evolved through means including devices employed to remove the effect of potential difference between logic ground and power ground on the comparative function of the circuit. A first zener diode in the circuit assures that a rise in the potential of the power ground node due to a varying amount of current returned by a number of other circuits does not effect the representation of current appearing as a voltage across a sense resistor. The connection of the zener diode, in effect, compensates for variations in ground voltage resulting from other print wire drivers being active at the same time. Additionally, the solenoid coil supply voltage, rather than and in place of a regulated voltage, is applied as an input to one of two components governing the differential voltage sensed at the inverting input of the comparative function of the circuit. Further, a second zener diode is included in the circuit to magnify or enhance the effective percentage voltage change and to achieve a more consistent wire fly time and impact force. The overall circuitry provides regulation and compensation for fluctuations in power reference ground due to the amount of current drawn in any one instant of time during operation or under operating conditions.

In view of the above discussion, the principal object of the present invention is to provide a voltage compensating circuit for driving a reactive load.

Another object of the present invention is to provide a current limiting driver circuit for electrically pulsing an inductive load.

An additional object of the present invention is to provide a compensating circuit that adjusts the current limit according to the prevailing level of power supply voltage.

A further object of the present invention is to provide means for compensating for fluctuations in power reference ground due to the amount of current drawn by other circuitry present in any one instant in time during operation.

Additional advantages and features of the present invention will become apparent and fully understood from a reading of the following description taken together with the annexed drawing.

DESCRIPTION OF THE PREFERRED EMBODIMENT

Figure 1:
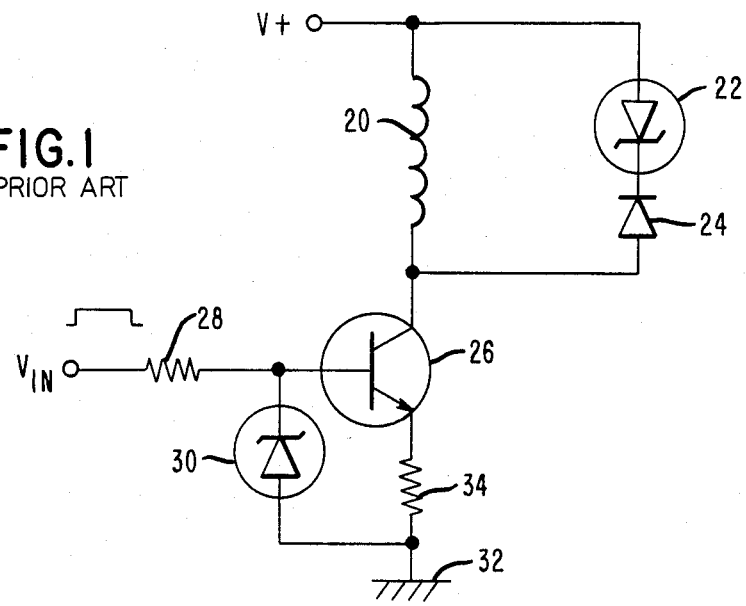
FIG. 1 is a schematic diagram of a typical prior art, linear current limiting circuit.

Prior to describing the drawing, it is advantageous to note that a common problem or potential problem in electrical equipment circuitry resides in the supply voltage or the voltage source that is applied to the equipment. It is not uncommon to realize a variation of as much as 15 percent above or below the nominal applied voltage and which variation, of course, has undesirable effects on the operation of the equipment. It is, therefore, an essential part of circuit design that some means of regulating the supply voltage or some means for compensating for the variation in the applied voltage must be considered and incorporated into the system.

One means of compensation has been used in prior printing equipment and which means includes or involves the step of detecting the voltage level and, dependent upon the range within which such voltage occurs or falls, causing the proper associated pulse width to be selected from an available range of pulse widths. The pulse width may be modified as a function of the power supply voltage and, depending upon whether the voltage is high or low, the selected pulse width may correspond to the supply voltage. It should be further noted that output sensitivity to voltage change is reduced by "current sourcing" the load. However, for an inductive load such as a print wire solenoid used for actuating a print wire in printing operations, the current rise time may be a significant fraction of the pulse width. This being the case, the rise time is inversely proportional to voltage, with the result being that the time at limiting current increases with increasing voltage and the output function continues to reflect the effect of voltage change.

It is known that in the case of wire matrix printers the supply voltage provided to drive the print wire solenoids can and does change in accordance with the number of solenoids that are simultaneously driven. In a particular prior driver circuit, as the number of solenoids being driven at any one time increases, the power ground potential of the supply voltage increases with the result that there is an error introduced in the current sensing portion of the circuit and less force is exerted in impact operation by the solenoid.

A compensating circuit as disclosed herein uses the ground voltage and the supply voltage to modify an enabling pulse to the driving circuitry. In the particular manner and arrangement, the circuit includes a buffer or like device that receives the enabling or input pulse for actuating the solenoid coil and the buffer also receives a supply voltage from a circuit that is grounded by connection through a zener diode to the power ground. Since the zener diode maintains the same breakdown voltage across its terminals, the reference voltage (from the zener diode) applied to the buffer increases as power ground increases, and as the supply voltage increases, the enabling pulse value passed by the buffer decreases. The compensating circuit provides for changing the duty cycle of the signal when more voltage is needed to drive the solenoid coil and the circuit includes the zener diode that is connected to power ground so that as the ground level changes the zener diode will have one terminal with a higher voltage provided to the input of the buffer.

In a specific application of the features of the present invention, in manner and form as related to a wire matrix print head, it has been determined that the wire actuating coil attains an optimum operating condition by use of a current-limited source. This method of operation provides for lower ohmic heating of the actuator coil, a higher operating speed and a lower peak current than is provided for in the case of voltage sourcing. While the advantages of current sourcing are noted, certain disadvantages include more complex circuitry than is required to limit current to each print wire and such complex circuitry is less efficient than "voltage sourcing" circuitry.

Two different methods of providing a regulated current to the actuating coil of a solenoid include first, a means for chopping the voltage supply and, secondly, a means for limiting the linear current. Referring to the second-mentioned means, a typical linear current-limiting circuit is illustrated in FIG. 1 wherein a voltage V+ is applied to an actuating coil 20 which is in parallel with a line containing a zener diode 22 and a blocking diode 24. The actuating coil 20 is connected to the collector of a power transistor 26 which has its base connected through a resistor 28 to an input voltage $V_{in}$. The base of the transistor 26 also is connected to a zener diode 30, which diode is connected to a power ground 32 along with a resistor 34 which also is connected to the emitter of the transistor 26. When the input voltage $V_{IN}$ to resistors 28 is brought high, the transistor 26 is turned on and a current is caused to flow through the resistor 34 to ground 32. The current through the resistor 34 is equal to $(V_z - V_{be})/R_e$. This current also is caused to flow in the collector of the transistor 26 and through the actuating coil 20. In the above equation, $V_z$ is the voltage across the zener diode 30, $V_{be}$ is the voltage across the base and emitter of the transistor 26, and $R_e$ is the resistance of resistor 34.

One disadvantage of the linear current-limited source for providing a regulated current in the system is that the power dissipation of the transistor 26 can become nominally high by reason that the transistor never attains the saturated condition. A sample calculation for a print wire element that is represented by a 2 ohm solenoid coil $R_{coil}$, a 28 voltage supply, a 1 ohm resistor $R_e$ and a limit current $I_{lim}$ of 2.5 amperes can be made by the equation:

$$P_{trans} = (28 - R_{coil} \times I_{lim} - R_e \times I_{lim})$$

$$I_{lim} \times \frac{\text{pulse width}}{\text{cycle time}}$$

$$P_{trans} = (28 - 2 \times 2.5 - 1 \times 2.5) 2.5$$

$$\times \frac{400 \text{ microseconds}}{1100 \text{ microseconds}} = 18.63 \text{ watts}$$

The effect of this equation is that the power dissipated by the transistor 26 equals 18.63 watts.

The second method of providing a regulated current to the actuating coil 20 is by means of a chopped current limit circuit. Generally described for this type circuit, the voltage across a sense resistor, as 34, in the emitter circuit of the drive transistor 26 is monitored as a representation of the current flowing through the coil 20. The drive transistor 26 is switched between saturation and cut off to keep this current in the desired range.

Figure 2:
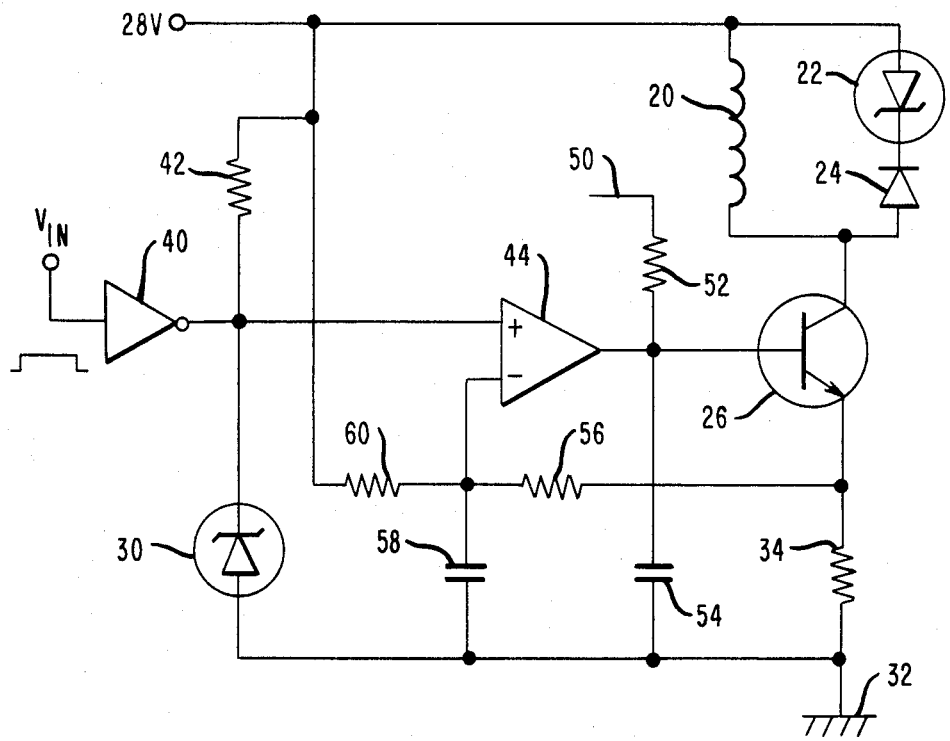
FIG. 2 is a schematic diagram of a preferred embodiment of the present invention.

An illustration of an application of the chopped current limit circuit or chopped voltage supply is shown in FIG. 2 wherein 28 volts is supplied to the actuating coil 20, which coil is in parallel with the zener diode 22 and the blocking diode 24. The actuating coil 20 is connected to the collector of the drive transistor 26 which has its emitter connected through the sense resistor 34 to the power ground 32. The logic level input pulse $V_{in}$ is brought to a buffer 40 which has its output connected through a resistor 42 to the 28 volt supply and which also has its output connected through the zener diode 30 to the power ground 32. The output of buffer 40 also is connected to the non-inverting input terminal of a comparator 44, the output of which is connected to the base of the drive transistor 26.

A signal or pulse 50 representing 15 volts is used to provide base current through a resistor 52 connected to the base of the drive transistor 26 and the connection also is made to a capacitor 54 connected to the power ground 32. The voltage across resistor 34 is input through a resistor 56, and also is connected to a capacitor 58 and additionally is connected to the inverting input terminal of the comparator 44. A resistor 60 is connected to the common connection of resistor 56 and capacitor 58 and provides a form of compensation for the voltage variation in the 28 volt supply.

Figure 3:
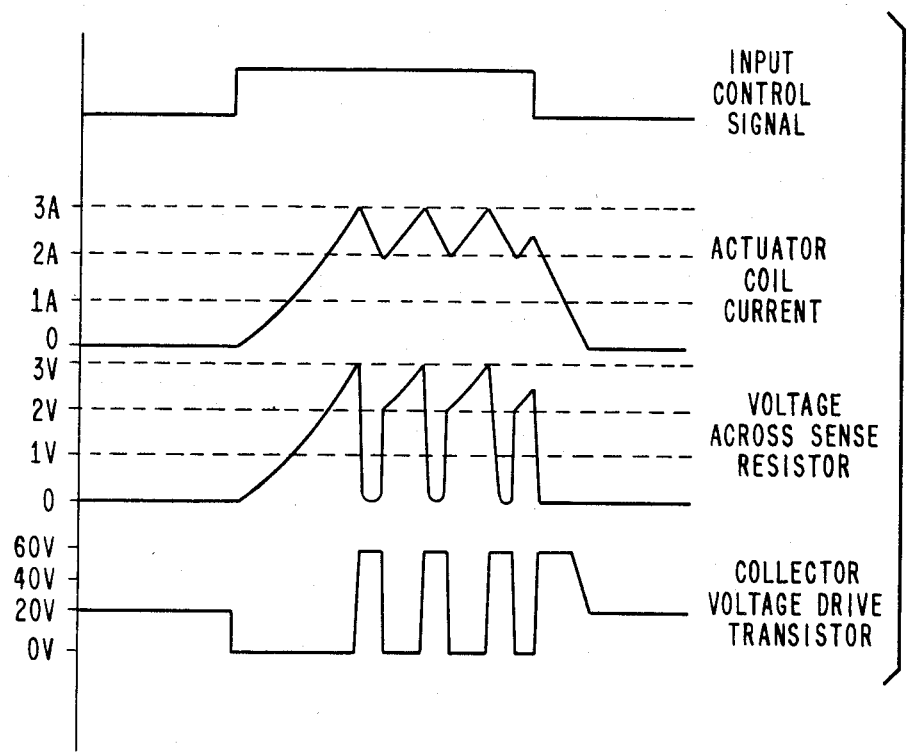
FIG. 3 is a timing diagram of waveforms associated with the drive circuit of FIG. 2.

FIG. 3 illustrates an input control signal and waveform diagrams of the actuator coil current from 0 and rising to 3 amperes, the voltage from 0 to 3 volts across the sense resistor 34 and the collector voltage from 0 to 60 volts on the drive transistor 26.

In the implementation of the circuit shown in FIG. 2, the voltage across the sense resistor 34 is applied through resistor 56 to the capacitor 58 and also is applied to the inverting input terminal of the comparator 44. When the voltage on the capacitor 58 reaches the reference voltage on the non-inverting input terminal of the comparator 44, the comparator switches the drive transistor 26 to the off condition. It should be noted here that the capacitor 54 is in the circuit and is connected to the base of the transistor 26 to prevent unwanted interference that may be generated in other drive circuits on the circuit board from causing erratic switching of the transistor.

After the transistor 26 is turned off, current from the actuating coil 20 is applied to the suppression circuit comprised of the zener diode 22 and the blocking diode 24. The voltage across the sense resistor 34 falls quickly so that the time constant comprised of resistor 56 and capacitor 58 and the hysteresis of the comparator input determine the off time of the drive transistor 26. After the voltage across capacitor 58 falls to a level that will switch comparator 44, the transistor 26 is turned on again and at this point in time the current in the coil 20 has fallen to a point determined by the voltage across the zener diode 22 in the suppression circuit.

As alluded to above, the resistor 60 provides a form of compensation for the variation in voltage of the 28 volt supply. Although the current through the actuating coil 20 is regulated within a certain range, the time of flight or flytime of the print wire is affected by the voltage potential applied when the coil is first turned on or energized. The resistor 60 causes the limit current to be raised in the case where the supply voltage is low and alternately lowers the current for a high voltage condition. In applying this compensation scheme to a wire matrix print head, the time of flight of a print wire can be maintained within a time range of 50 microseconds between supply voltages in the range between 24 and 32 volts.

It has been found that when a plurality of print wires were activated at the same time, as in the case of a vertical bar of dots being printed by the print head, the current limit was substantially reduced to each print wire with consequent reduction in the print density of dots according to the number of dots being printed at any one time. This phenomenon was caused by the rise in voltage on the power ground node of the print head driver circuit when high currents were being drawn through the actuating coils. An example of this condition, in the case of a nominal current of 2.5 amperes $\times$ 7 wires, gave a total current load of 17.5 amperes and wherein the voltage at the top of the sense resistor 34 no longer gave an accurate representation of the current in the actuating coil 20 since the voltage at the grounded terminal of the resistor was rising a few volts above ground potential. The solution to this problem and a further means and form of compensation in the circuit was the addition of the zener diode 30 that determines the reference voltage applied to the noninverting input terminal of the comparator 44. The anode of the diode 30 is connected very close to the grounded terminal of the sense resistor 34 and it is seen that the buffer 40, which is in the form of an open collector TTL inverter gate, is used to provide a reference to the comparator 44 and to clamp this reference voltage to ground when it is desired to deactivate the circuit.

In order to protect the drive transistor 26 and the associated print head in the event of a controller failure, the signal or pulse 50 is applied through the resistor 52 to provide the base current to the transistor. Since the output of the comparator 44 is an open collector, removal of the signal 50 prevents the circuit from operating if the input is held in the on condition. It is seen that the current limited chop circuit of FIG. 2 is inherently self-protected against shorted coils since the current is limited regardless of the load through the coil 20. It is also seen that since the drive transistor 26 is operated predominantly in saturation and cut off conditions, the power dissipated therefrom is much lower than for the linear current limit arrangement as illustrated in FIG. 1. Further, in the case of the chopper circuit of FIG. 2, it is seen that transistor 26 heating, as well as zener diode 22 heating, is directly affected by the frequency of operation. Consequently, the selected transistor 26 is a Darlington transistor which has a relatively slower switching speed and which speed is further slowed by the capacitor 54 connected to the base of the transistor. Since more heat is generated in the case of longer switching times and which times represent longer active operation of the transistor 26 during transition between saturation and cut off conditions, it has been determined that the best compromise between smooth current waveform (high frequency) and lowered transistor heating (low frequency) is at a chopping rate of 15 KHz. This rate of operation allows printing of 40 column lines at a 100% duty cycle at room temperature for an indefinite period of time without the requirement of a heat sink on the drive transistor 26.

Figure 4:
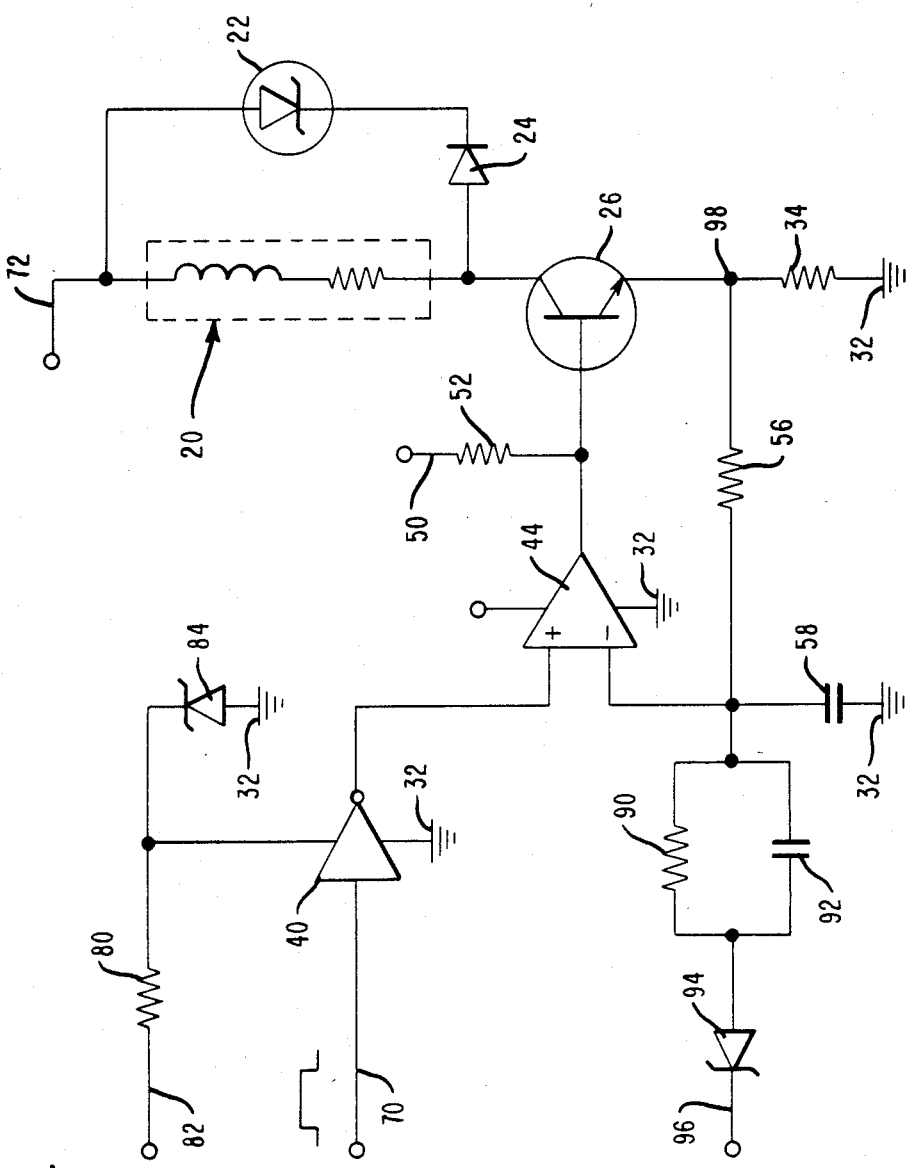
FIG. 4 is a schematic diagram of a modification of the present invention.

FIG. 4 is a modified current limiting driver circuit for providing higher order or more precise compensation in the manner of referencing the positive or non-inverting input terminal of comparator 44 to the power ground 32 connected through the sense resistor 34. A logic level input pulse 70 is received at the input terminal of the buffer 40 and is fed therethrough to the non-inverting input terminal of the comparator 44. The signal is passed to the base of the drive transistor 26, thereby turning the transistor on and allowing the load coil 20 to be energized from the voltage source 72. Since the value of the sense resistor 34 is less than the value of resistor 56, substantially the entire coil current is conducted to the power ground 32 through the resistor 34. The potential drop across such resistor 34 is proportional to the current flowing through the coil 20 and this voltage is reflected in the voltage level applied at the negative or inverting input terminal of the comparator 44. The system is biased in an arrangement so that when the current builds up to the desired upper limit, the output of the comparator 44 declines and the drive transistor 26 is turned off. As the magnetic field decays, the current being conducted through the zener diode 22 and the blocking diode 24 decreases. The output of the comparator 44 resumes feeding the base of transistor 26, thereby turning the transistor on and the current builds up again to energize the coil 20. This cycle continues until the input signal 70 goes to the low condition.

It is seen that when seven or nine of these driver circuits are utilized to drive all the 7 or 9 print wires in a print head, the total current load may exceed 20 amperes when all the coils ae energized. At the time of this high current flow, the impedance of the ground return from each of the sense resistors 34 allows the voltage above the resistor to rise by 1 or 2 volts. If the voltage levels in this portion of the circuit are left to float or are not compensated, the average voltage above the resistor 34 will remain constant with respect to the driver logic and the actual voltage across the sense resistor 34 and thus the regulated current will fall below the desired value and cause poor print quality.

The driver circuit of FIG. 4 is compensated by the addition of a resistor 80 connecting a voltage source 82 with the buffer 40 and with a zener diode 84, in turn, connected to the power ground 32. The compensating circuit of resistor 80 and diode 84 references the positive or non-inverting input terminal of the comparator 44 to the power ground 32 fed by the sense resistor 34. It should be noted that the buffer 40 and the comparator 44 are connected to power ground 32. It is further seen that when different numbers of print wires are fired simultaneously, the desired voltage is maintained across the resistor 34 and thus the desired current is applied to and conducted through the actuating coil 20 to drive each print wire. The result of providing a compensated voltage is that the quality of print is much improved through uniform dot density.

The lines containing resistor 56 along with a resistor 90 and a capacitor 92 essentially constitute a voltage dividing network which under steady conditions causes a voltage equal to $(V_b - V_z - V_a)/(1 + R_3/R_2)$ to be applied at the negative or inverting input terminal of the comparator 44. A zener diode 94 is connected between the resistor 90 and an applied voltage 96. In the equation above, $V_b$ is the voltage at point 96, $V_z$ is the voltage at zener diode 94 and $V_a$ is the voltage at point 98 above the resistor 34. $R_3$ is the value of resistor 90 and $R_2$ is the value of resistor 56.

The conventional method of compensation (one used in past practice) was to supply the voltage 96 from the regulated voltage at 82; however, it was seen that if the voltage applied to the negative or inverting input terminal of comparator 44 was to track the voltage 72 above the coil 20, a compensating effect for any change in the voltage at 72 would be realized in the limit level of the current. A mathematical analysis of the dynamic performance of the circuit predicted that the required effect would result if the voltage at 72, instead of the voltage at 82, was applied at point 96 and certain circuit constants were adjusted accordingly. The component designations, voltages and circuit element values used in the circuit of FIG. 4 are as follows:

| | |
|---|---|
| Buffer 40 | Texas Instruments No. 7406 or equal |
| Comparator 44 | National Semiconductor No. LM339 or equal |
| Transistor 26 | RCA No. 2N6388 or equal |
| Voltage at Terminal 82 | 12 volts |
| Resistor 34 | 1 ohm/3 watts |
| Resistor 56 | 1.8 kilo ohms |
| Resistor 90 | 33 kilo ohms |
| Resistor 80 | 360 ohms |
| Resistor 52 | 2.2 kilo ohms |
| Load Coil 20 | 2 ohms/8 mhenry coil |
| Diode 24 | Texas Instruments No. 1N4002 or equal |
| Capacitor 92 | .0033 microfarads |
| Capacitor 58 | .022 microfarads |
| Diode 22 | 39 volts zener diode |
| Diode 84 | 3.6 volts zener diode |
| Diode 94 | 5.6 volts zener diode |

The test results confirmed the theoretical analysis as to the effect of applying the supply voltage 72 at the terminal 96 instead of the conventional practice of applying a regulated voltage, as at 82, to the terminal 96. It was then found that if the voltage at terminal 72 was decreased from its nominal figure of 28 volts to 24 volts, the current limits at a higher level, thereby causing the impact force to hold up to a higher threshold. Conversely, if the voltage at terminal 72 was increased from 28 volts to 32 volts, the current limits at a lower level and thereby prevents an excessive increase in impact force.

Further, it was reasoned that the compensation could be enhanced or improved by increasing the relative swing of the voltage seen at the negative or inverting input terminal of the comparator 44 corresponding with variation of the voltage at 72. The addition of the 5.6 volts zener diode 94 achieves a higher order of compensation in the circuit and the impact force level is maintained within narrow limits as the supply voltage to the coil 20 is varied from 24 volts to 32 volts.

The driver circuit for compensating for changes in supply voltage is accomplished in a first step of adding the resistor 80 and the zener diode 84 which has its output terminal connected to the power ground bus 32 and thereby holds the collector voltage of the buffer 40 at a constant value with respect to power ground. The second step applies the coil power supply voltage at 72, instead of the regulated voltage at 82, to the terminal 96 which is the input applying to one of the two components governing the differential voltage sensed at the negative input terminal of the comparator 44. The third step adds the zener diode 94 between terminal 96 and the resistor 90 for the purpose of enhancing the effect produced by the second step.

It is thus seen that herein shown and described is a current limiting driver circuit for pulsing reactive loads such as a solenoid coil for a wire matrix print head, which circuit compensates for changes in supply voltage so that the flight time and the impact force of the print wire are maintained within a narrow range. The apparatus of the present invention enables the accomplishment of the objects and advantages mentioned above, and while a preferred embodiment and a modification have been disclosed herein, other variations thereof may occur to those skilled in the art. It is contemplated that all such variations not departing from the spirit and scope of the invention hereof are to be construed in accordance with the following claims.

We claim:

1. A compensated reference voltage arrangement for pulsing a reactive load comprising a
   reactive load, a
   supply voltage, a
   comparator providing an output, a
   transistor having its base coupled to said output and having means for coupling its collector to said reactive load, a
   resistor coupled to the emitter of said transistor and to a fixed ground for sensing emitter voltage, a
   buffer having an input voltage coupled thereto and having an output coupled to an input terminal of said comparator,
   resistor means and capacitor means coupled to the supply voltage and to the emitter of the transistor for controlling flow of current through the reactive load, and
   diode means coupled to the fixed ground and to the buffer output for determining the maximum voltage applied to the input terminal of the comparator.

2. The compensated reference voltage arrangement of claim 1 including diode means connected in parallel with said reactive load for receiving current therefrom when the transistor is turned off.

3. The compensated reference voltage arrangement of claim 1 wherein the resistor means and capacitor means include a resistor and a capacitor coupled to the inverting input of the comparator and are responsive to the voltage across the resistor coupled to the emitter of the transistor for determining off time thereof.

4. The compensated reference voltage arrangement of claim 1 wherein said diode means is a zener diode.

5. The compensated reference voltage arrangement of claim 2 wherein each of said diode means is a zener diode.

6. A compensating circuit for supplying a constant current to a load comprising a
   load to be supplied by the current, a
   voltage source coupled to the load, a
   comparator providing an output, a
   transistor having its collector coupled to the load and its base coupled to the comparator output, a
   first resistor coupled to the emitter of the transistor and to a fixed ground for sensing current through the load, a
   buffer coupled to receive an input pulse and having an output coupled to the non-inverting input of the comparator, a
   second resistor coupled to the emitter of the transistor and to the inverting input of the comparator, a
   third resistor coupled to the second resistor and to an applied voltage to provide a voltage dividing network, and a
   fourth resistor and diode means coupled to a voltage supply and to the buffer for referencing the voltage applied to the non-inverting input of the comparator.

7. The compensating circuit of claim 6 including diode means connected in parallel with said load for receiving current therefrom when the transistor is turned off.

8. The compensating circuit of claim 6 herein the voltage applied to the voltage dividing network is the voltage source connected with the load.

9. The compensating circuit of claim 6 including a zener diode connected with the voltage dividing network and with the applied voltage to reference the voltage at the comparator with the voltage source at the load.

10. A current-limiting circuit for pulsing a reactive load comprising a
    reactive load, a
    supply voltage coupled to the reactive load, a
    comparator providing an output, a
    transistor having its collector coupled to the reactive load and its base coupled to the comparator output, a
    first resistor coupled to the emitter of the transistor and to a fixed ground, a
    buffer coupled to receive an input pulse and having an output coupled to the non-inverting input of the comparator, a
    voltage dividing network coupled to the emitter of the transistor and to a supply voltage, and a
    resistor and diode means coupled to the buffer and to a regulated supply voltage for referencing the voltage applied to the non-inverting input of the comparator.

11. The current limiting circuit of claim 10 including diode means connected in parallel with said reactive load for receiving current therefrom when the transistor is turned off.

12. The current limiting circuit of claim 10 including a zener diode connected with the voltage dividing network and with the supply voltage reference the voltage at the comparator with the supply voltage at the reactive load.

13. In a driver circuit for pulsing a reactive load having a voltage supplied thereto, a reactive load for receiving the voltage, a comparator providing an output to the base of a transistor having its collector coupled to the reactive load, a resistor coupled to the emitter of the transistor and to a fixed ground, a regulated voltage supply, and a buffer having an input and an output coupled to the non-inverting input of the comparator, the improvement comprising
    resistor and diode means coupled to the buffer and to said regulated voltage supply to reference the input voltage of the comparator relative to the fixed ground.

14. A voltage compensating circuit comprising a
    supply voltage, a
    comparator providing an output, a buffer coupled to receive an input pulse and having an output coupled to the non-inverting input of the comparator, a transistor coupled to said output and coupled to said supply voltage, a resistor coupled to the transistor and to a fixed ground, and resistor means and capacitor means coupled to the supply voltage and to the transistor for referencing and compensating the voltage applied to the input of the comparator.

15. A current-limiting circuit comprising a supply voltage, a comparator providing an output, a transistor coupled to the output and to the supply voltage, a resistor coupled to the transistor and to a fixed ground, a buffer coupled to receive an input pulse and having an output coupled to the non-inverting input of the comparator, a voltage dividing network coupled to the transistor and to a supply voltage, and a resistor and diode means coupled to the buffer and to a regulated supply voltage for referencing the voltage applied to the non-inverting input of the comparator.

* * * * *